(12) United States Patent
Tabatowski-Bush

(10) Patent No.: US 9,404,956 B2
(45) Date of Patent: Aug. 2, 2016

(54) VEHICLE WITH SELECTABLE BATTERY PACK ISOLATION DETECTION CIRCUITRY USING PRECISION RESISTORS

(75) Inventor: Benjamin A. Tabatowski-Bush, South Lyon, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 1261 days.

(21) Appl. No.: 13/329,835

(22) Filed: Dec. 19, 2011

(65) Prior Publication Data

US 2013/0154656 A1 Jun. 20, 2013

(51) Int. Cl.
*B60L 11/14* (2006.01)
*G01R 31/02* (2006.01)
*B60L 11/18* (2006.01)
*G01R 31/36* (2006.01)

(52) U.S. Cl.
CPC .............. *G01R 31/025* (2013.01); *B60L 11/14* (2013.01); *B60L 11/1805* (2013.01); *B60L 11/1853* (2013.01); *B60L 11/1864* (2013.01); *G01R 31/36* (2013.01); *Y02T 10/70* (2013.01); *Y02T 10/7005* (2013.01); *Y02T 10/7061* (2013.01); *Y02T 10/7077* (2013.01)

(58) Field of Classification Search
CPC ...... G01R 31/36; G01R 31/025; G01R 31/02; G01R 19/00; G01R 31/12; Y02T 10/7077; Y02T 10/7005; Y02T 10/70; Y02T 10/7061; B60L 11/14; B60L 11/1805; B60L 11/1853; B60L 11/1864; B60L 11/18
USPC ........... 324/426, 434; 361/424; 320/104, 109; 180/65.1, 65.21
See application file for complete search history.

(56) References Cited

U.S. PATENT DOCUMENTS

| | | | | |
|---|---|---|---|---|
| 3,872,386 A | * | 3/1975 | Luhowy | 324/98 |
| 3,895,284 A | * | 7/1975 | Schweizer et al. | 320/134 |
| 4,231,025 A | * | 10/1980 | Turner, Jr. | 340/521 |
| 4,577,149 A | * | 3/1986 | Zbinden | 324/72.5 |
| 4,633,418 A | * | 12/1986 | Bishop | 702/63 |
| 4,979,072 A | * | 12/1990 | Ito et al. | 361/87 |
| 5,003,244 A | * | 3/1991 | Davis, Jr. | 320/119 |
| 5,382,946 A | | 1/1995 | Gale | |
| 5,481,194 A | * | 1/1996 | Schantz et al. | 324/522 |
| 5,606,242 A | * | 2/1997 | Hull et al. | 320/106 |
| 5,646,534 A | * | 7/1997 | Kopera | 324/434 |
| 5,652,499 A | * | 7/1997 | Morita et al. | 320/112 |
| 5,670,861 A | * | 9/1997 | Nor | 320/118 |
| 5,686,839 A | * | 11/1997 | Takagi | 324/503 |
| 5,764,027 A | * | 6/1998 | Harvey | 320/125 |
| 5,824,883 A | * | 10/1998 | Park et al. | 73/40 |
| 5,994,876 A | * | 11/1999 | Canny et al. | 320/132 |

(Continued)

FOREIGN PATENT DOCUMENTS

| | | | | |
|---|---|---|---|---|
| JP | 2003169401 A | * | 6/2003 | B60L 3/00 |
| JP | 2007149561 A | * | 6/2007 | |

*Primary Examiner* — Richard Isla Rodas
*Assistant Examiner* — John Trischler
(74) *Attorney, Agent, or Firm* — David B. Kelley; Brooks Kushman P.C.

(57) ABSTRACT

A power system for a vehicle includes at least two battery packs spaced away from each other. A first battery pack includes a plurality of battery cells and a switching element electrically connected with the battery cells. A second battery pack includes a resistor electrically connected in series with the switching element, and sense circuitry configured to detect voltage across the resistor indicative of leakage current associated with the first battery pack.

9 Claims, 2 Drawing Sheets

(56) References Cited

U.S. PATENT DOCUMENTS

| | | | | |
|---|---|---|---|---|
| 6,094,053 | A * | 7/2000 | Harvey | 324/434 |
| 6,114,839 | A * | 9/2000 | Takano et al. | 320/150 |
| 6,320,389 | B1 * | 11/2001 | Tamesue et al. | 324/509 |
| 6,700,384 | B2 * | 3/2004 | Yugou | 324/434 |
| 6,998,819 | B2 * | 2/2006 | Jin | 320/136 |
| 7,026,788 | B2 * | 4/2006 | Yano et al. | 320/104 |
| 7,132,833 | B2 * | 11/2006 | Layden et al. | 324/429 |
| 7,453,232 | B2 * | 11/2008 | Furukawa | 320/104 |
| 7,579,811 | B2 * | 8/2009 | Sato | H01M 10/4264 320/132 |
| 7,592,815 | B2 * | 9/2009 | Yano | 324/509 |
| 7,952,327 | B2 * | 5/2011 | Kudo et al. | 320/116 |
| 8,179,094 | B2 * | 5/2012 | Anupindi | G06F 1/263 307/23 |
| 8,319,650 | B2 * | 11/2012 | Volodymyr et al. | 340/636.1 |
| 8,552,733 | B2 * | 10/2013 | Park et al. | 324/509 |
| 2001/0052777 | A1 * | 12/2001 | Belau et al. | 324/525 |
| 2002/0011935 | A1 | 1/2002 | Kim | |
| 2003/0114885 | A1 * | 6/2003 | Nova et al. | 607/2 |
| 2005/0012506 | A1 * | 1/2005 | Yudahira | 324/511 |
| 2005/0231217 | A1 * | 10/2005 | Carruthers | 324/691 |
| 2006/0132086 | A1 * | 6/2006 | Altenburg et al. | 320/106 |
| 2007/0013382 | A1 | 1/2007 | Hinz et al. | |
| 2009/0079434 | A1 * | 3/2009 | Osawa et al. | 324/434 |
| 2010/0156426 | A1 * | 6/2010 | Kang et al. | 324/444 |
| 2011/0101920 | A1 * | 5/2011 | Seo et al. | 320/127 |
| 2011/0127964 | A1 * | 6/2011 | Nishida | H01M 10/44 320/118 |
| 2011/0156618 | A1 * | 6/2011 | Seo et al. | 318/3 |
| 2011/0169452 | A1 * | 7/2011 | Cooper | H02J 7/0021 320/116 |
| 2011/0199223 | A1 * | 8/2011 | Akimov et al. | 340/636.1 |
| 2012/0105220 | A1 * | 5/2012 | Wang | 340/438 |
| 2012/0139549 | A1 * | 6/2012 | Sufrin-Disler et al. | 324/433 |
| 2013/0119935 | A1 * | 5/2013 | Sufrin-Disler | B60L 3/0046 320/116 |
| 2013/0293198 | A1 * | 11/2013 | Nakashima | H02J 7/0016 320/118 |
| 2014/0035594 | A1 * | 2/2014 | Kamata | G01R 31/025 324/509 |
| 2014/0368211 | A1 * | 12/2014 | Inoue | B60L 3/0069 324/509 |
| 2015/0048798 | A1 * | 2/2015 | Godo | B60L 11/1861 320/134 |
| 2015/0061688 | A1 * | 3/2015 | Loftus | 324/509 |
| 2015/0168497 | A1 * | 6/2015 | Tabatowski-Bush | |
| 2015/0175027 | A1 * | 6/2015 | Garcia-Flores | |

\* cited by examiner

US 9,404,956 B2

VEHICLE WITH SELECTABLE BATTERY PACK ISOLATION DETECTION CIRCUITRY USING PRECISION RESISTORS

TECHNICAL FIELD

This disclosure relates to isolation detection circuitry for battery packs used in automotive vehicles.

BACKGROUND

High voltage may be required to increase the output of a power supply for driving an electric or hybrid-electric vehicle: output is proportional to the product of voltage and current. The output voltage of a power supply for driving an electric or hybrid-electric vehicle, for example, may be 200 V or more. These power supplies may not be grounded. Hence, leakage currents associated with these power supplies may be undesirable. A leakage current may exist when a resistance between a power supply and chassis is present.

SUMMARY

A vehicle may include first and second battery packs spaced away from each other within the vehicle, and a leakage detection circuit. The leakage detection circuit may include a first precision resistor disposed within the first battery pack and electrically connected with chassis ground, and a switching element and first series limiting resistor disposed within the second battery pack and electrically connected in series with the first precision resistor. The leakage detection circuit responds to leakage currents within the second battery pack.

A vehicle may include a plurality of battery packs positioned at different locations within the vehicle. One of the packs may include a plurality of resistors each being electrically connected with chassis ground and a different one of the packs, and sense circuitry configured to detect voltage across each of the resistors. The vehicle may further include at least one controller configured to determine presence of leakage currents associated with other of the packs based on the detected voltages.

A power system for a vehicle may include a first battery pack including a plurality of battery cells and a switching element electrically connected with the battery cells. The power system may also include a second battery pack spaced away from the first battery pack and including a resistor electrically connected in series with the switching element, and sense circuitry configured to detect voltage across the resistor indicative of leakage current associated with the first battery pack.

DETAILED DESCRIPTION

As required, detailed embodiments of the present invention are disclosed herein; however, it is to be understood that the disclosed embodiments are merely exemplary of the invention that may be embodied in various and alternative forms.

The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
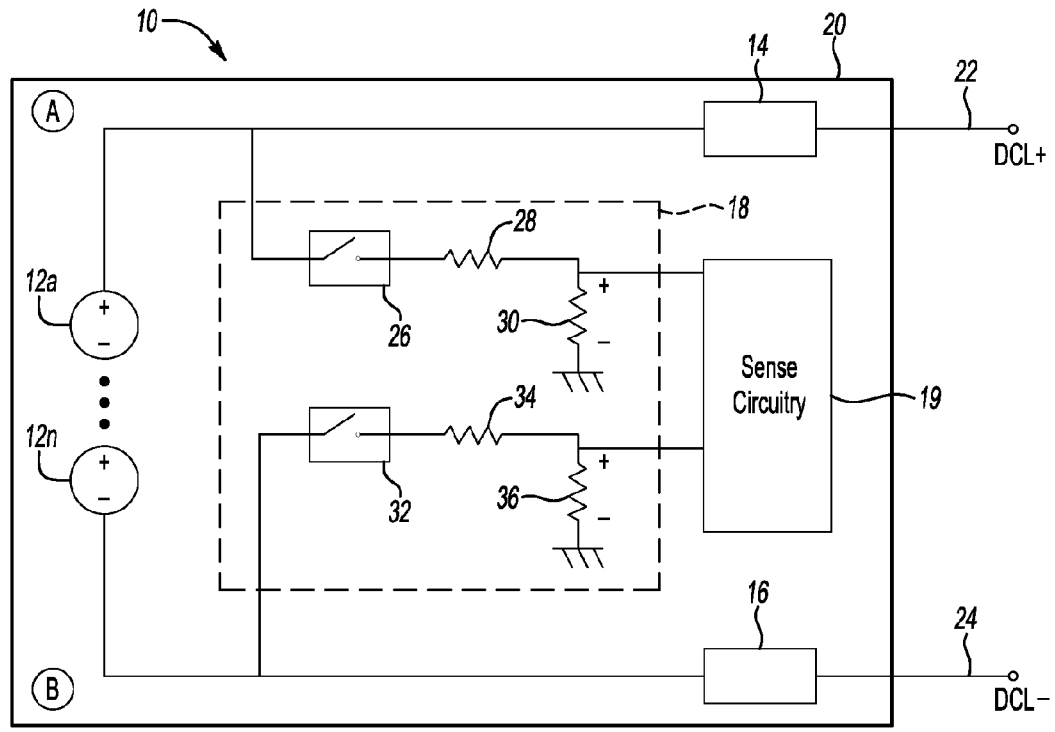
FIG. 1 is a schematic diagram of a battery pack and associated isolation detection circuitry for an automotive vehicle.

Referring to FIG. 1, a battery pack 10 for an automotive vehicle (not shown) may include a plurality of battery cells 12a-12n (electrically connected in series), switches 14, 16 (e.g., contactors, etc.), isolation detection circuitry 18, and sense circuitry 19 disposed within a housing 20. The switches 14, 16 may be closed to electrically connect the battery cells 12a-12n to terminals 22, 24 associated with a high voltage bus. As known in the art, an electric machine configured to generate motive power for the vehicle may be electrically connected with such a high voltage bus. Hence, the battery cells 12a-12n may provide electrical current for consumption by the electric machine.

The isolation detection circuitry 18 includes a switch 26, a (series limiting) resistor 28, and a (precision) resistor 30 electrically connected in series between chassis ground and a node defined by the electrical connection between the battery cell 12a and the switch 14 (referred to herein as node A). The isolation detection circuitry 18 also includes a switch 32, a (series limiting) resistor 34, and a (precision) resistor 36 electrically connected in series between chassis ground and a node defined by the electrical connection between the battery cell 12n and the switch 16 (referred to herein as node B). The voltage across each of the resistors 30, 36 is proportional to the current flowing through them.

A current leak at node A may be detected by opening the switch 26, closing the switches 14, 16, 32, and measuring the voltage across the resistor 36. (That is, an Ohmic leak is intentionally created between node B and the chassis, and the resulting voltage across the resistor 36 is measured via the sense circuitry 19. Ohm's law may then be used to determine the current flowing through the resistor 36, which is equal to the leakage current associate with node A.) Similarly, a current leak at node B may be detected by opening the switch 32, closing the switches 14, 15, 26 and measuring the voltage across the resistor 30. Other techniques and architectures may also be used to detect current leaks in a single battery pack.

Figure 2:
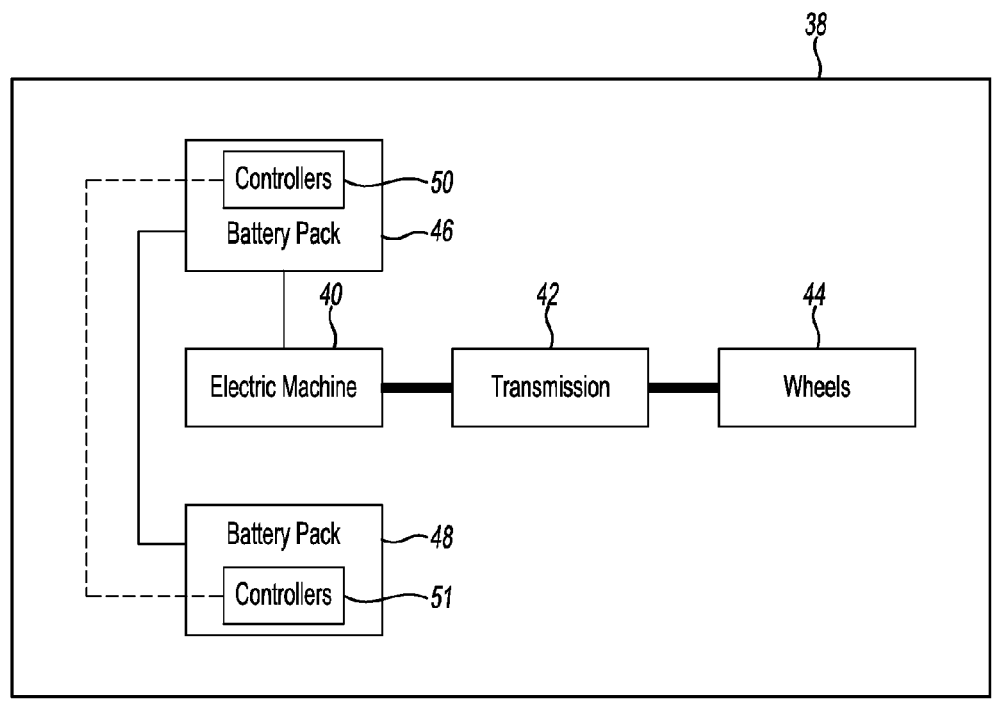
FIG. 2 is a block diagram of an alternatively powered vehicle having a distributed set of battery packs.

Referring to FIG. 2, an alternatively powered vehicle 38 (e.g., a battery electric vehicle, a hybrid-electric vehicle, a plug-in hybrid-electric vehicle, etc.) may include an electric machine 40 (e.g., motor, motor/generator, etc.), a transmission 42 (e.g., power-split, mechanical, etc.), and wheels 44. The electric machine 40 is arranged to mechanically drive the transmission 42 (as indicated by thick line), and the transmission 42 is arranged to mechanically drive the wheels 44 (as indicated by thick line). If the vehicle 38 is a hybrid-type vehicle, it may of course include an engine (not shown) arranged to also selectively mechanically drive the transmission 42. Other arrangements are also possible.

The vehicle 38 may also include battery packs 46, 48 (or more battery packs in certain arrangements) and controllers 50, 51 disposed within the battery packs 46, 48 respectively. The battery packs 46, 48 are electrically connected together (as indicated by thin line) in series, and the battery pack 46 is electrically connected with the electric machine 40 (as indicated by thin line). Hence, the battery packs 46, 48 may provide electrical current for consumption by the electric machine 40. In the example of FIG. 2, the battery packs 46, 48 are distributed throughout the vehicle 38. That is, the battery pack 46 is positioned in a certain location within the vehicle 38 (e.g., inside the vehicle's cabin) and the battery pack 48 is positioned in a different location within the vehicle 38 (e.g., underneath the vehicle's cabin). Such battery pack arrangements may be used to better package battery cells within the vehicle 38. In other examples, the controllers 50, 51 may be separate from the battery packs 46, 48; the battery packs 46, 48 may be electrically connected together in parallel; and/or the battery packs 46, 48 may each be electrically connected with the electric machine 40. Other arrangements are also contemplated.

The battery pack 46 is in communication with/under the control of the controller 50. The battery pack 48 is in communication with/under the control of the controller 51. The controllers 50, 51 are in communication with each other (as indicated dashed line).

Current leaks may occur within either or both of the battery packs 46, 48. Hence, it may be desirable to detect the presence of such leaks. Merely providing isolation detection circuitry similar to that described with respect to FIG. 1 in each of the battery packs 46, 48, however, may not be practical. It may be cost prohibitive, for example, to provide sense circuitry similar to that described with respect to FIG. 1 in each of the battery packs 46, 48. Moreover, it may be difficult to coordinate isolation checks of battery packs so arranged. As discussed in more detail below, the battery packs 46, 48 may include isolation detection circuitry that enables the detection of current leaks with centrally located sense circuitry.

Figure 3:
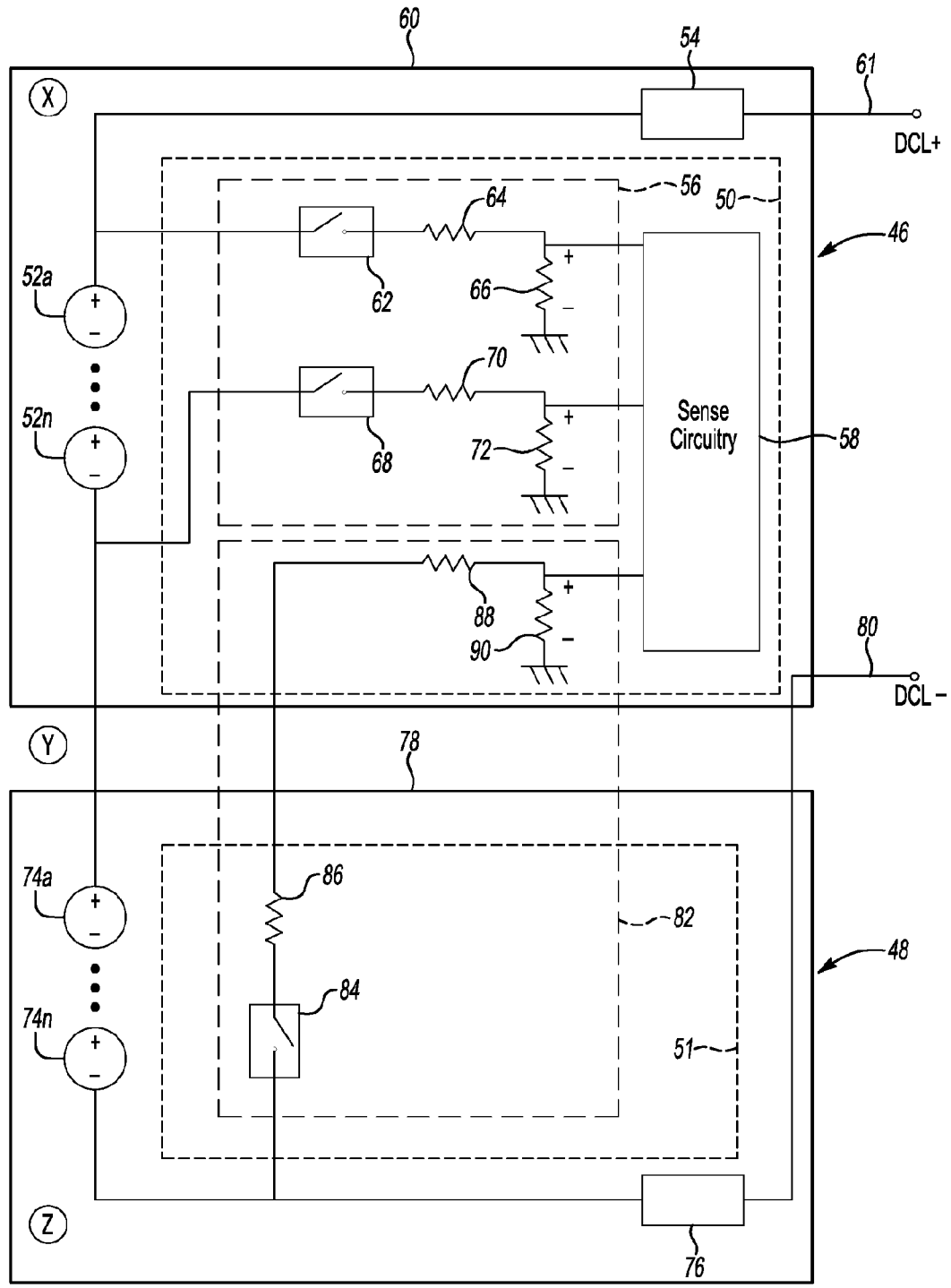
FIG. 3 is a schematic diagram of the distributed set of battery packs of FIG. 2 and associated isolation detection circuitry.

Referring to FIG. 3, the battery pack 46 may include the controller 50, a plurality of battery cells 52a-52n (electrically connected in series), switch 54 (e.g., a contactor, etc.), isolation detection circuitry 56, and sense circuitry 58 disposed within a housing 60. The switch 54 may be closed to electrically connect the battery cells to a terminal 61, which is electrically connected with a high voltage bus (not shown). The electric machine 40 (FIG. 2) is also electrically connected with this high voltage bus.

The isolation detection circuitry 56 may include a switch 62, a (series limiting) resistor 64, and a (precision) resistor 66 electrically connected in series between chassis ground and a node defined by the electrical connection between the battery cell 52a and the switch 54 (referred to herein as node X). The isolation detection circuitry 56 may also include a switch 68, a (series limiting) resistor 70, and a (precision) resistor 72 electrically connected in series between chassis ground and a node defined by the electrical connection between the battery cell 52n and a battery cell 74a (referred to herein as node Y). The voltage across each of the resistors 66, 72 is proportional to the current flowing through them.

The battery pack 48 may include the controller 51, a plurality of battery cells 74a-74n (electrically connected in series) and switch 76 disposed within a housing 78. The switch 76 may be closed to electrically connect the battery cells to a terminal 80, which is electrically connected with the high voltage bus described above and the electric machine 40 (FIG. 2).

Isolation detection circuitry 82 is distributed between the battery packs 46, 48. That is in the example of FIG. 3, the isolation detection circuitry 82 may include a switch 84 and a (series limiting) resistor 86 disposed within the housing 78, and a (series limiting) resistor 88 and a (precision) resistor 90 disposed within the housing 60. Hence, the centrally located sense circuitry 58, which in this example happens to be associated with the battery pack 46, may be used to detect the voltage across any of the resistors 66, 72, 90 by way of an analog to digital converter whose reference node is connected with chassis ground. A multiplexer circuit as commonly found in such converters may then be used to select among the voltages associated with the resistors 66, 72, 90.

The switch 84 and resistor 86 are electrically connected in series between the resistor 88 and a node defined by the electrical connection between the battery cell 74n and the switch 76 (referred to herein as node Z). The resistors 88, 90 are electrically connected in series between chassis ground and the resistor 86. The resistors 86, 88 prevent excessive current from flowing through them when their associated wires are shorted. Either of the resistors 86, 88, in other examples, may be omitted. Such omission, however, may result in thermal or other issues.

The controller 50 may include, inter alia, the isolation detection circuitry 56, the sense circuitry 58, and the resistors 88, 90. The controller 51 may include, inter alia, the switch 84 and the resistor 86. Other configurations are also contemplated.

This architecture may be used with any number of battery packs. That is, a central battery pack may include centrally located sense circuitry and (precision) resistors electrically connected with chassis ground for each of a set of satellite battery packs. Each of the (precision) resistors may then be electrically connected with a switch located within a corresponding satellite battery pack via one or more (series limiting) resistors located within the satellite battery pack and/or the central battery pack similar to that described with reference to FIG. 3. Other arrangements are also possible.

The controllers 50, 51 may operate to determine whether the isolation detection circuits 56, 82 and sense circuitry 58 are in proper working order: (a) the switch 68 may be opened, the switches 62, 84 may be closed, and the voltages across the resistors 66, 90 and the voltage from node X to node Z may be measured. This information may then be evaluated according to (1) and (2):

$$V\text{pack-est}=((V66/R66)*(R66+R64))+((V90/R90)*(R90+(R88+R86))) \tag{1}$$

$$|V\text{pack-est}-VXZ|\leq\alpha \tag{2}$$

where VXZ is the voltage difference between the nodes X and Z, V66 is the voltage across the resistor 66, V90 is the voltage across the resistor 90, R64, R66, R86 and R88 are the resistances of the resistors 64, 66, 86 and 88 respectively, and α is a predetermined value; (b) the switch 84 may be opened, the switches 62, 68 may be closed, and the voltages across the resistors 66, 72 and the voltage from node X to node Y may be measured. This information may then be evaluated according to (3) and (4):

$$V2\text{pack-est}=((V66/R66)*(R66+R64))+((V72/R72)*(R72+R70)) \tag{3}$$

$$|V2\text{pack-est}-VXY|\leq\beta \tag{4}$$

where VXY is the voltage difference between the nodes X and Y, V66 is the voltage across the resistor 66, V72 is the voltage across the resistor 72, R64, R66, R70 and R72 are the resistances of the resistors 64, 66, 70 and 72 respectively, and β is a predetermined value; and (c) the switch 62 may be opened, the switches 68, 84 may be closed, and the voltages across the resistors 72, 90 and the voltage from node Y to node Z may be measured. This information may then be evaluated according to (5) and (6):

$$V3\text{pack-est}=((V90/R90)*(R90+R88))+((V72/R72)*(R72+R70)) \tag{5}$$

$$|V3\text{pack-est}-VYZ|\leq\gamma \tag{6}$$

where VYZ is the voltage difference between the nodes Y and Z, V90 is the voltage across the resistor 90, V72 is the voltage across the resistor 72, R70, R72, R88 and R90 are the resistances of the resistors 70, 72, 88 and 90 respectively, and γ is a predetermined value.

If (2), (4) and (6) are true, the isolation detection circuits 56, 82 and sense circuitry 58 are in proper working order. If any of (2), (4) and (6) is not true, the isolation detection circuits 56, 82 or sense circuitry 58 may not be in proper working order.

The controllers 50, 51 may perform a leakage check from node X to chassis: the switch 84 may be closed, the switches 62, 68 may be opened, and the voltage across the resistor 90, V90, and the voltage from node X to node Z, VXZ, may be measured. The system leakage resistance, Rleakx, may then be expressed as a function of VXZ and V90:

$$VXZ*(R90/(R90+R88+R86+Rleakx))=V90 \qquad (7)$$

where R86, R88 and R90 are the known resistances of the resistors 86, 88, 90 respectively. (7) may be rearranged to solve for Rleakx using known techniques.

The controllers 50, 51 may perform a leakage check from node Z to chassis: the switch 62 may be closed, the switches 68, 84 may be opened, and the voltage across the resistor 66, V66, and the voltage from node X to node Z, VXZ, may be measured. The system leakage resistance, Rleakz, may then be expressed as a function of VXZ and V66:

$$VXZ*[R66/(R66+R64+Rleakz)]=V66 \qquad (8)$$

where R64 and R66 are the known resistances of the resistors 64, 66 respectively. (8) may be rearranged to solve for Rleakz using known techniques.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A vehicle comprising:
   first and second batteries respectively disposed within first and second housings defining mutually exclusive interiors;
   a first resistor, disposed within the first housing, electrically connected with chassis ground;
   both a switch and second resistor, disposed within the second housing, electrically connected in series with the first resistor; and
   sense circuitry disposed only within the first housing to measure voltage across the first resistor to detect leakage current within the second housing.

2. The vehicle of claim 1, further comprising a third resistor disposed within the first housing and electrically connected with chassis ground.

3. The vehicle of claim 2, wherein the sense circuitry is further configured to measure voltage across the third resistor to detect leakage current within the first housing.

4. The vehicle of claim 1, further comprising an electric machine configured to transform electrical power from the batteries into motive power to move the vehicle.

5. A vehicle comprising:
   first and second batteries respectively disposed within first and second housings defining mutually exclusive interiors, the first housing completely containing sense circuitry and a first resistor electrically connected with chassis ground, the second housing containing both a switch and second resistor electrically connected in series with the first resistor, and the sense circuitry configured to detect voltage across the first resistor to detect leakage current in the second housing.

6. The vehicle of claim 5, wherein the first resistor is a precision resistor.

7. A vehicle power system comprising:
   a first housing completely containing a first battery, sense circuitry, and a first resistor electrically connected with chassis ground; and
   a second housing containing a second battery, and both a switch and second resistor electrically connected in series with the first resistor, the first and second housings defining mutually exclusive interiors, and the sense circuitry configured to detect voltage across the first resistor to detect leakage in the second housing.

8. The system of claim 7, wherein the first resistor is a precision resistor.

9. The system of claim 7, wherein the first housing further includes a third resistor and wherein the sense circuitry is further configured to detect voltage across the third resistor to detect leakage current in the first housing.

\* \* \* \* \*